United States Patent
Shay

(10) Patent No.: US 9,257,973 B1
(45) Date of Patent: Feb. 9, 2016

(54) SUPPLY-STATE-ENABLED LEVEL SHIFTER INTERFACE CIRCUIT AND METHOD

(71) Applicant: Texas Instruments Incorporated, Dallas, TX (US)

(72) Inventor: Michael J. Shay, Fariview, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 14/532,151

(22) Filed: Nov. 4, 2014

(51) Int. Cl.
| H03K 19/0185 | (2006.01) |
| H03K 3/356 | (2006.01) |
| H03K 19/003 | (2006.01) |

(52) U.S. Cl.
CPC .... *H03K 3/356104* (2013.01); *H03K 3/356182* (2013.01); *H03K 19/00361* (2013.01); *H03K 19/018507* (2013.01); *H03K 19/018528* (2013.01)

(58) Field of Classification Search
CPC ............... H03K 3/35613; H03K 3/356182; H03K 19/00346; H03K 19/00361; H03K 19/0185–19/018528
See application file for complete search history.

(56) References Cited

U.S. PATENT DOCUMENTS

| 6,262,599 | B1 * | 7/2001 | Coughlin, Jr. ... | H03K 19/09429 326/68 |
| 7,005,908 | B2 * | 2/2006 | Lee ...................... | H03K 17/223 326/68 |
| 7,414,453 | B2 * | 8/2008 | Tachibana ........ | H03K 3/356113 326/68 |
| 7,675,345 | B2 * | 3/2010 | Fayed .................... | H03K 3/012 326/62 |
| 8,587,359 | B2 * | 11/2013 | Saether .......... | H03K 19/018521 327/333 |
| 2004/0207450 | A1 * | 10/2004 | Ando ..................... | H03K 3/012 327/333 |

* cited by examiner

*Primary Examiner* — Patrick O'Neill
(74) *Attorney, Agent, or Firm* — Michael A. Davis, Jr.; Frank D. Cimino

(57) ABSTRACT

An enable circuit receives an input enable signal that is referenced to a first voltage and generates a level-shifted output enable signal referenced to a second voltage. Bias control circuitry prevents shoot-through currents during ramping of the first voltage and from causing indeterminate logic levels of the level-shifted output enable signal. An enabled level-shifting circuit receives an input logic signal that is referenced to the first voltage and generates a level-shifted output logic signal referenced to the second voltage. Enable circuitry operates in response to the level-shifted output enable signal to enable normal level-shifting operation while the first and second voltages are at normal operating levels and prevents shoot-through currents in the enabled level-shifting circuit from causing indeterminate levels of the level-shifted output logic signal.

20 Claims, 4 Drawing Sheets

SUPPLY-STATE-ENABLED LEVEL SHIFTER INTERFACE CIRCUIT AND METHOD

BACKGROUND OF THE INVENTION

The present invention relates generally to level-shifting circuits having a first power supply voltage level and a different second power supply voltage level and also relates to using techniques that essentially prevent current leakage that causes indeterminate voltage/logic levels during circuit operation when one of the supply voltage levels is at a low level and the other supply voltage level is at a high level. More particularly, the invention relates to level shifting circuitry the operation of which is independent of the order of ramping of the two power supply voltages.

In FIG. 1, conventional level-shifting circuit 1-1 includes a CMOS inverter INV1 having its input coupled to receive an input signal $V_{IN}$ and its output connected by a conductor or node ND3 to the input of another CMOS inverter INV2 and also to the gate of a N-channel transistor MN1 having its source connected to ground. The output of inverter INV2 is connected by a conductor ND4 to the gate of a N-channel transistor MN2 having its source connected to ground. CMOS inverters INV1 and INV2 are coupled between a first power supply voltage $V_{SUPPLY1}$ and ground or $V_{SS}$. The drain of transistor MN1 is connected by node ND1 to the drain of a P-channel transistor MP1 and the gate of a P-channel transistor MP2. The sources of transistors MP1 and MP2 are connected to a second supply voltage $V_{SUPPLY2}$. The gate of transistor MP1 is connected by a node or conductor ND2 to the drains of transistors MP2 and MN2 and to the gate electrodes of a CMOS output inverter including a P-channel transistor MP5 and a N-channel transistor MN5. The source of transistor MP5 is connected to $V_{SUPPLY2}$ and its drain is connected by a $V_{OUT}$ conductor 6 to the drain of transistor MN5, the source of which is connected to ground. During normal operation, transistors MP1, MP2, MN1 and MN2 form a level shifter. Transistors MP1 and MP2 are "latching transistors" that form the latching portion of the level shifter which also includes N-channel selection transistors MN1 and MN2. In the case wherein $V_{SUPPLY1}$ is at a high or ON voltage level, transistors MN1 and MN2 are driven in response to $V_{SUPPLY1}$, causing them to control latching transistors MP2 and MP1 by controlling the voltages on nodes ND1 and ND2, respectively. When the gate of one of the latching transistors MP1 or MP2 is pulled to a low voltage level, the drain of that transistor MP1 or MP2 is driven high to the $V_{SUPPLY2}$ level. This in turn couples $V_{SUPPLY2}$ to the gate of the opposite latching transistor MP2 or MP2, turning it off. This operation generates "determinate" or predetermined logic levels on nodes ND1 and ND2.

However, in the case wherein $V_{SUPPLY1}$ is at a low OFF voltage level and the second supply voltage $V_{SUPPLY2}$ is at a high ON voltage level, it can be seen in Prior Art FIG. 1 that circuit nodes ND1 and ND2 are high impedance nodes which are at indeterminate voltage levels and indeterminate logic states when the first supply voltage. Under these indeterminate voltage levels and logic states, latching transistors MP1 and MP2 no longer operate as part of the above-mentioned standard level shifter that produces determinate logic levels at its outputs. This can lead to CMOS inverter "shoot-through" current dissipation in the CMOS output inverter consisting of P-channel transistor MP5 and N-channel transistor MN5 which generates the output voltage $V_{OUT}$ on conductor 6. Nodes ND3 and ND4 in FIG. 1 also are high impedance nodes, and have voltages between 0 volts and approximately one MOS diode voltage $V_T$ above ground ($V_{SS}$). This causes N-channel transistors MN1 and MN2 to be OFF, but if the voltages of both nodes ND1 and ND2 maintain a weak inversion bias level in either of P-channel transistors MP1 and MP2, this may cause a shoot-through current to flow from the $V_{SUPPLY2}$ to ground. Under these conditions, $V_{OUT}$ may be at an indeterminate voltage and an indeterminate logic level.

Referring next to the prior art level-shifting circuit 1-2 in FIG. 2, it can be seen that transistors MP1 and MN1 are both ON and provide known or determinate voltage levels and logic levels when $V_{SUPPLY1}$ is at a low OFF level and $V_{SUPPLY2}$ is at a high ON level. The prior art two-supply level shifting circuit 1-2 shown in FIG. 2 attempts to address the above-described shoot-through current problem and the indeterminate voltage/logic levels of level-shifting circuit 1-1 in Prior Art FIG. 1 by providing an additional P-channel transistor MP3 having its source coupled to $V_{SUPPLY2}$ through a current-limiting MOS resistor R0. The drain of transistor MP3 is connected to node ND2, and its gate is connected to node ND4. The gate of MOS resistor R0 is connected to the body electrodes of transistors MP2 and MP3. The circuit shown in FIG. 2 also differs from the circuit shown in FIG. 1 by including a N-channel transistor MN3 having its gate connected to node ND2, its source connected to ground, and its drain connected to node ND1. During normal operation, transistors MP1 and MP2 form the latch portion of a level shifter which generates determinate logic levels on nodes ND1 and ND2.

However, if the value of $V_{SUPPLY2}$ minus $V_{SUPPLY1}$ is large enough to produce a gate-to-source turn-on voltage on transistor MP3, a shoot-through current will flow through transistor MP3 and through transistor MP1 to ground. The level of this shoot-through current may be controlled by appropriate sizing of current-limiting or degeneration resistor R0. However, for very low desired shoot-through current levels (of the order of tens of nanoamperes), this forces the resistive degeneration to be so great that level shifting circuit 1-2 may have unacceptable shoot-through current leakage when $V_{SUPPLY1}$ is at its very low OFF value and the voltage of node ND2 has "floated" up to a sufficiently high level to cause transistor MP1 to be in a weak-inversion ON condition. Transistor MN3 functions as a feedback element which is in place when transistor MP3 drives node ND2 high. Specifically, when $V_{SUPPLY1}$ is OFF its voltage is coupled by conductor ND4 to the gate of transistor MN3, thus pulling node ND1 low. Prior art level-shifting circuit 1-2 of FIG. 2 assumes that nodes ND4 and ND3 will be equal essentially to zero volts at all times when $V_{SUPPLY1}$ is at a low OFF level. One weakness of prior art level-shifting circuit 1-2 is that the voltages of node conductors ND3 and ND4 can "float up" as a result of parasitic capacitive coupling when $V_{SUPPLY1}$ is low, and this can create a shoot-through current leakage condition through transistor MN2.

In FIG. 2, for the case where $V_{SUPPLY1}$ is equal to zero, the output node ND4 of inverter INV2 is in a "floating" high impedance state within a voltage range from ground to 1 CMOS threshold $V_T$ above ground. A voltage high enough to cause both P-channel transistor MP3 and N-channel transistor MN2 to go into their weak inversion conditions can easily be coupled to node ND4. Inverter INV1 is "immune" to shoot-through currents when $V_{SUPPLY1}$ is essentially equal to zero, but the voltage of node ND3 can float upward and may cause transistor MP1 to be a leakage source. When this occurs, the cross-coupled P-channel transistors MP1 and MP2 can both be in their ON conditions but nevertheless in a non-latched condition. This can result in the gate voltage on node ND1 driving the output inverter transistor pair MN4/MP4 and the gate voltage on node ND2 driving the output inverter transistor pair MN5/MP5 so as to produce indeterminate levels, respectively, between $V_{SUPPLY2}$ and $V_{SS}$. This can result in an unacceptably high amount of shoot-through current flowing from $V_{SUPPLY2}$ to $V_{SS}$ so that the outputs $V_{OUT}$ and $V_{OUTZ}$ are at indeterminate voltage levels and logic states.

The standard prior art cross-coupled P-channel level shifters do not have circuit topologies that avoid the above mentioned shoot-through currents when $V_{SUPPLY1}$ is OFF and consequently do not have reliable known output logic levels when $V_{SUPPLY1}$ is OFF.

It should be understood that the need for independence from power-supply ramp-up order is necessary in systems that rely on one of multiple power supplies to, in effect, act as an external master power-on reset signal. The MIPI[rffe] serial communication specification requires the VIO supply voltage (i.e., Vsupply1 in subsequently described FIG. 3) that is provided by a master MIPI communication controller to act as both the serial port supply as well as a master reset signal.

It should be noted that the MIPI Alliance is a global, collaborative organization comprised of companies that span the mobile "ecosystem" and are committed to defining and promoting interface specifications for mobile devices. A broad portfolio of interface specifications from the MIPI Alliance enables design engineers to efficiently interconnect essential components in a mobile device, from the modem and antenna to the peripherals and application processor. Most state-of-the-art smart phones employ at least two MIPI specifications. Some products employ MIPI specifications for a full range of internal connections. MIPI specifications have enabled manufacturers to simplify the design process, reduce design costs, create economies of scale that lower price points, and shorten time-to-market for components, features, and services. Fundamentally, every MIPI specification addresses the industry needs for three characteristics that are essential for any successful mobile design: low power consumption, high-performance operations, and low electromagnetic interference (EMI). MIPI currently has a pair of high-speed physical-layer (PHY) specifications, M-PHY and D-PHY, to support a full range of application requirements in mobile terminals.) In the case that VIO supply voltage is powered down and a separately regulated $V_{CC}$ supply is powered up, the level shifters that normally translate between VIO levels to $V_{CC}$ logic levels must function appropriately to provide a master reset to the rest of the integrated circuit chip. Despite the fact that there is no VIO power, the level-shifter circuit should draw no significant current due to high-impedance "floating" nodes in the circuit and the output of the level shifter should be ensured.

Thus, there is an unmet need for a way of avoiding shoot-through currents in a CMOS level shifting circuit that is powered by multiple power supplies.

There also is an unmet need for a way of avoiding shoot-through currents in a CMOS level shifting circuit that is powered by multiple power supplies wherein the voltage provided by the power supplies is at an inactive or OFF level and the voltage provided by another of the power supplies is at an active or ON level.

SUMMARY OF THE INVENTION

It is an object of the invention to provide a circuit and method for avoiding shoot-through currents in a CMOS level shifting circuit that is powered by multiple power supplies.

It is another object of the invention to provide a circuit and method for avoiding shoot-through currents in a CMOS level shifting circuit that is powered by multiple power supplies and which the voltage provided by the power supplies is at an inactive or OFF level and the voltage provided by another of the power supplies is at an active or ON level.

Briefly described, and in accordance with one embodiment, the present invention provides an enable circuit (1-3) which receives an input enable signal ($PGOOD_{IN}$) that is referenced to a first voltage ($V_{SUPPLY1}$) and generates a level-shifted output enable signal ($PGOOD_{OUT}$) that is referenced to a second voltage ($V_{SUPPLY2}$). Bias control circuitry (16-1, 2,3) prevents shoot-through currents during ramping of the first voltage from causing indeterminate logic levels of the level-shifted output enable signal. An enabled level-shifting circuit (1-4) receives an input logic signal ($V_{IN}$) that is referenced to the first voltage and generates a level-shifted output logic signal ($V_{OUT}$) that is referenced to the second voltage. Enable circuitry (P1,P2,N1,N2) operates in response to the level-shifted output enable signal to enable normal level-shifting operation while the first and second voltages are at normal operating levels and prevents shoot-through currents in the enabled level-shifting circuit from causing indeterminate levels of the level-shifted output logic signal.

In one embodiment, the invention provides level-shifting circuitry (1-3,1-4) including an enable circuit (1-3) receiving an input enable signal ($PGOOD_{IN}$) that is referenced to a first supply voltage ($V_{SUPPLY1}$) and also generating a corresponding level-shifted output enable signal ($PGOOD_{OUT}$) that is referenced to a second supply voltage ($V_{SUPPLY2}$). The enable circuit (1-3) includes bias control circuitry (16-1,2,3) which both prevents shoot-through currents from occurring in the enable circuit (1-3) during ramping of the first supply voltage ($V_{SUPPLY1}$) and also prevents indeterminate voltage and logic levels of the level-shifted output enable signal ($PGOOD_{OUT}$) during the ramping of the first supply voltage ($V_{SUPPLY1}$). And enabled level-shifting circuit (1-4) receives an input logic signal ($V_{IN}$) that is referenced to the first supply voltage ($V_{SUPPLY1}$) and also generates a corresponding level-shifted output logic signal ($V_{OUT}$) that is referenced to the second supply voltage ($V_{SUPPLY2}$). The enabled level-shifting circuit (1-4) includes enable circuitry (P1,P2,N1,N2) which operates in response to the level-shifted output enable signal ($PGOOD_{OUT}$) to enable normal level-shifting operation while the first ($V_{SUPPLY1}$) and second ($V_{SUPPLY2}$) supply voltages are at normal operating levels and to prevent the shoot-through currents from occurring in the enabled level-shifting circuit (1-4) during the ramping of the first supply voltage ($V_{SUPPLY1}$) and also to force the level-shifted output logic signal ($V_{OUT}$) to a predetermined level during the ramping of the first supply voltage ($V_{SUPPLY1}$).

In one embodiment, the enable circuit (1-3) includes a first CMOS inverter (P7,N7), a second CMOS inverter (P8,N8), and a third CMOS inverter (P9,N9) all coupled between the first supply voltage ($V_{SUPPLY1}$) and a reference voltage (GND), an input of the first CMOS inverter (P7,N7) and an input of the third CMOS inverter (P9,N9) each receiving the input enable signal ($PGOOD_{IN}$), an input of the second CMOS inverter (P8,N8) being coupled to an output (12) of the first CMOS inverter (P7,N7), an output (ND3A) of the third CMOS inverter (P9,N9) being coupled to a first input (ND3A) of a level shifter circuit (P10,P11,N10,N11) that is coupled between the first supply voltage ($V_{SUPPLY1}$) and the reference voltage (GND), an output (ND4A) of the second CMOS inverter (P8,N8) being coupled to a second input (ND4A) of the level shifter circuit (P10,11,N10,11).

In one embodiment, the bias control circuitry (16-1,2,3) includes first (16-1), second (16-2) and third (16-3) transistor pairs, a first output (ND1A) of the level shifter circuit (P10, 11,N10,11) being cross-coupled to a gate of a first transistor (P11) of the level shifter circuit (P10,11,N10,11), a second output (ND2A) of the level shifter circuit (P10,11,N10,11) being cross-coupled to a gate of a second transistor (P10) of the level shifter circuit (P10,11,N10,11).

In one embodiment, the first transistor pair (16-1) includes a first transistor (NA1) having a drain coupled to the second supply voltage ($V_{SUPPLY2}$) and a gate coupled to the first input (ND3A) of the level shifter circuit (P10,11,N10,11), wherein the first transistor pair (16-1) also includes a second transistor (PD1) having a source coupled to a source of the first transistor (NA1), a gate coupled to the first supply voltage ($V_{SUPPLY1}$), and a drain coupled to the first input (ND3A) of the level shifter circuit (P10,11,N10,11). The second transistor pair (16-2) includes a third transistor (NA2) having a drain coupled to the second supply voltage ($V_{SUPPLY2}$) and a gate coupled to the second output (ND2A) of the level shifter circuit (P10,11,N10,11), and the second transistor pair (16-2) also includes a fourth transistor (PD2) having a source coupled to the drain of the third transistor (NA2), a gate connected to the first supply voltage ($V_{SUPPLY1}$), and a drain coupled to the second output (ND2A) of the level shifter circuit (P10,11,N10,11). The third transistor pair (16-3) includes a fifth transistor (NLV1) having a drain coupled to the second input (ND4A) of the level shifter circuit (P10,11,N10,11) and a gate coupled to the reference voltage (GND), and wherein the third transistor pair (16-3) also includes a sixth transistor (PD3) having a source coupled to a source of the fifth transistor (NLV1), a gate coupled to the first supply voltage ($V_{SUPPLY1}$), and a drain coupled to the reference voltage (GND). The enable circuit (1-3) includes a CMOS output inverter (P12,N12) having an input coupled to one of the first and second outputs (ND2A) of the level shifter circuit (P10,11,N10,11) and an output (13) on which the level-shifted output enable signal ($PGOOD_{OUT}$) is produced.

In one embodiment, the first (NA1) and third (NA2) transistors transistor pair are N-channel intrinsic threshold transistors and the fifth transistor (NLV1) is a N-channel LVT (low threshold voltage) transistor. In one embodiment, the second (PD1), fourth (PD2), and sixth (PD3) transistors of the first (16-1), second (16-2), and third (16-3) transistor pairs, respectively, are P-channel depletion mode transistors.

In one embodiment, body electrodes of the first (NA1), third (NA2), and fifth (NLV1) transistors of the first (16-1), second (16-2), and third (16-3) transistor pairs, respectively, are connected to the reference voltage (GND), and wherein body electrodes of the second (PD1), fourth (PD2), and sixth (PD3) of the first (16-1), second (16-2), and third (16-3) transistor pairs, respectively are connected to their corresponding sources. The transistor pairs (16-1,2,3) each have a corresponding output node and each actively drive its output node when the first supply voltage ($V_{SUPPLY1}$) is at a first level (OFF) and wherein when the first supply voltage ($V_{SUPPLY1}$) is at a second level (ON) a source of the depletion mode transistor (PD1, PD2, or PD2) rises proportionately with the first supply voltage ($V_{SUPPLY1}$) causing a bulk-to-source body-effect-induced shift in a threshold voltage ($V_T$) of the intrinsic transistor (NA1, NA2, or NLV1) turning that intrinsic transistor and that depletion mode transistor OFF.

In one embodiment, the drain of the first transistor (NA1) is coupled to the second supply voltage ($V_{SUPPLY2}$) by means of a first resistor (R1) so as to perform the function of reducing transient current spikes, wherein the drain of the third transistor (NA2) is coupled to the second supply voltage ($V_{SUPPLY2}$) by means of a second resistor (R2) so as to perform the function of reducing transient current spikes, and wherein the drain of the fifth transistor (NLV1) is coupled to the second input (ND4A) of the level shifter circuit (P10,11, N10,11) by means of a third resistor (R3) so as to perform the function of reducing transient current spikes, and wherein the third CMOS inverter (P9,NA4,N9) includes an intrinsic N-channel transistor (NA4) coupled between the drain of a P-channel transistor (P9) of the third CMOS inverter and the first input (ND3A) of the level shifter circuit (P10,11,N10, 11).

In one embodiment, the level shifter circuit (P10,11,N10, 11) includes first (N10) and second (N11) input transistors each having a source coupled to the reference voltage (GND) and first (P10) and second (P11) cross-coupled latching transistors each having a source coupled to the second supply voltage ($V_{SUPPLY2}$), the first input transistor (N10) having a gate coupled to a first level shifter input (ND3A) and the second input transistor (N11) having a gate coupled to a second level shifter input (ND4A), the first latching transistor (P10) having a drain coupled by a fourth resistor (R4) to a first level shifter output conductor (ND1A) to a gate of the second latching transistor (P11) and the drain of the first input transistor (N10), the second latching transistor (P11) having a drain coupled by a fifth resistor (R5) to a second level shifter output conductor (ND2A) to a gate of the first latching transistor (P10) and a drain of the second input transistor (N11), wherein the fourth resistor (R4) performs the function of improving the speed level shifter transition rates and reducing shoot-through currents and the fifth resistor (R5) also performs the function of improving the speed level shifter transition rates and reducing shoot-through currents.

In one embodiment, enabled level-shifting circuit (1-4) includes a first CMOS inverter (INV1) having an input (5) coupled to receive the input logic signal ($V_{IN}$) and an output coupled to an input of a second CMOS inverter (INV2) and to a first input (ND3) of an enabled level shifter circuit (20), an output of the second CMOS inverter (INV2) being coupled to a second input (ND4) of the enabled level shifter circuit (20), the first (INV1) and second (INV2) CMOS inverters being powered by the first supply voltage ($V_{SUPPLY1}$). The enabled level shifter circuit (20) include cross-coupled first (MP1) and second (MP2) latching transistors, the first latching transistor (MP1) having a drain coupled by a first level shifter output conductor (ND1) to a gate of the second latching transistor (MP2) and the drain of a first input transistor (MN1) having its gate coupled to the first input (ND3) of the enabled level shifter circuit (20) and its source coupled to the reference voltage (GND), the second latching transistor (MP2) having a drain coupled by a second level shifter output conductor (ND2) to a gate of the first latching transistor (MP1) and a drain of a second input transistor (MN2) having a gate coupled to the second input (ND4) of the enabled level shifter circuit (20) and a source coupled to the reference voltage (GND). First (P1) and second (P2) enable transistors each having a source coupled to the second supply voltage ($V_{SUPPLY2}$) and a gate coupled to the level-shifted output enable signal ($PGOOD_{OUT}$), a drain of the first enable transistor (P1) being coupled to a source of the first latching transistor (MP1), the drain of the second enable transistor (P2) being coupled to the source of the second latching transistor (MP2). One of the first (ND1) and second (ND2) outputs of the enabled level shifter circuit (20) being coupled to an input of a CMOS output inverter (MP5,MN5) the output of which produces the level-shifted output logic signal ($V_{OUT}$).

In one embodiment, the gates of the first (P1) and second enable transistors (P2) are coupled to the level-shifted output enable signal ($PGOOD_{OUT}$) by means of an inverter (19). The enabled level shifter circuit (20) includes third (N1) and fourth (N2) enable transistors each having a source coupled to the first reference voltage (GND) and a gate coupled to the level-shifted output enable signal (PGOOD$_{OUT}$) by means of the inverter (19). The drains of the third (N1) and fourth (N2) enable transistors are coupled to the first (ND1) and second (ND2) outputs, respectively, of the enabled level shifter circuit (20). The first (P1) and second (P2) enable transistors and the first (MP1) and second (MP2) latching transistors are P-channel transistors and wherein the third (N1) and fourth (N2) enable transistors are N-channel transistors In one embodiment, the invention provides a method for operating level-shifting circuitry (1-3,1-4) powered by first (V$_{SUPPLY1}$) and second (V$_{SUPPLY2}$) supply voltages to avoid shoot-through currents and indeterminate voltage levels and indeterminate logic levels in the level-shifting circuitry (1-3, 1-4) during ramping of the first supply voltage (V$_{SUPPLY1}$), the method including applying an input enable signal (PGOOD$_{IN}$) that is referenced to the first supply voltage (V$_{SUPPLY1}$) to an input (11) of an enable circuit (1-3); generating a level-shifted output enable signal (PGOOD$_{OUT}$) that is referenced to the second supply voltage (V$_{SUPPLY2}$) in response to the input enable signal (PGOOD$_{IN}$) by operating bias control circuitry (16-1,2,3) in the enable circuit (1-3) so as to prevent shoot-through currents from occurring in the enable circuit (1-3) during ramping of the first supply voltage (V$_{SUPPLY1}$) and also to prevent occurrence of the indeterminate voltage levels and indeterminate logic levels of the level-shifted output enable signal (PGOOD$_{OUT}$) during ramping of the first supply voltage (V$_{SUPPLY1}$); applying an input logic signal (V$_{IN}$) that is referenced to the first supply voltage (V$_{SUPPLY1}$) to an input (5) of an enabled level-shifting circuit (1-4); and generating a level-shifted output logic signal (V$_{OUT}$) that is referenced to the second supply voltage (V$_{SUPPLY2}$) in response to the input logic signal (V$_{IN}$) by operating an enabled level-shifting circuit (1-4) including enable circuitry (P1,P2,N1,N2) in response to the level-shifted output enable signal (PGOOD$_{OUT}$) to enable normal level-shifting operation of the enabled level-shifting circuit (1-4) while the first (V$_{SUPPLY1}$) and second (V$_{SUPPLY2}$) supply voltages are at normal operating levels and to prevent the shoot-through currents from occurring in the enabled level-shifting circuit (1-4) during the ramping of the first supply voltage (V$_{SUPPLY1}$) and to force the level-shifted output logic signal (V$_{OUT}$) to a predetermined level during the ramping of the first supply voltage (V$_{SUPPLY1}$).

In one embodiment, the method includes utilizing transistor pairs in the enable circuit (1-3), wherein each transistor pair includes an intrinsic threshold transistor (e.g., NA1) having a drain coupled to the second supply voltage (V$_{SUPPLY2}$) and a gate coupled to an input (e.g., ND3A) of a level shifter circuit (P10,11,N10,11) and a source coupled to a source of a low-threshold transistor (e.g., PD1), wherein the transistor pairs (16-1,2,3) each have a corresponding output node and each actively drive its output node when the first supply voltage (V$_{SUPPLY}$) is at a first level (OFF) and wherein when the first supply voltage (V$_{SUPPLY1}$) is at a second level (ON) a source of the depletion mode transistor (PD1, PD2, or PD2) rises proportionately with the first supply voltage (V$_{SUPPLY1}$) causing a bulk-to-source body-effect-induced shift in a threshold voltage (V$_T$) of the intrinsic transistor (NA1, NA2, or NLV1) turning that intrinsic transistor OFF.

In one embodiment, the method includes preventing the shoot-through currents and the indeterminate logic levels in the enabled level-shifting circuit (1-4) by providing first (P1) and second (P2) enable transistors each having a source coupled to respond to the second supply voltage (V$_{SUPPLY2}$) and a gate coupled to respond to the level-shifted output enable signal (PGOOD$_{OUT}$), a drain of the first enable transistor (P1) being coupled to a source of a first cross-coupled latching transistor (MP1) of an enabled level-shifter (20), a drain of the second enable transistor (P2) being coupled to the source of a second cross-coupled latching transistor (MP2).

In one embodiment, the method includes providing third (N1) and fourth (N2) enable transistors in the enabled level-shifting circuit (01-4), the third (N1) and fourth (N2) enable transistors each having a source coupled to the first reference voltage (GND) and a gate coupled to respond to the level-shifted output enable signal (PGOOD$_{OUT}$), drains of the third (N1) and fourth (N2) enable transistors being coupled to first (ND1) and second (ND2) outputs, respectively, of the enabled level shifter circuit (20). In one embodiment, the shoot-through current is static shoot-through current.

In one embodiment, the invention provides level-shifting circuitry (1-3,1-4) powered by first (V$_{SUPPLY1}$) and second (V$_{SUPPLY2}$) supply voltages to avoid shoot-through currents and indeterminate voltage levels and indeterminate logic levels in the level-shifting circuitry (1-3,1-4) during ramping of the first supply voltage (V$_{SUPPLY1}$), including an input (11) coupled to receive an input enable signal (PGOOD$_{IN}$) that is referenced to a first supply voltage (V$_{SUPPLY1}$); enable circuit means (1-3) for generating a corresponding level-shifted output enable signal (PGOOD$_{OUT}$) that is referenced to a second supply voltage (V$_{SUPPLY2}$) in response to the input enable signal (PGOOD$_{IN}$) by operating bias control circuitry (16-1, 2,3) so as to prevent shoot-through currents from occurring in the enable circuit means (1-3) during the ramping of the first supply voltage (V$_{SUPPLY1}$) and also to prevent occurrence of indeterminate voltage levels and indeterminate logic levels of the level-shifted output enable signal (PGOOD$_{OUT}$) during the ramping of the first supply voltage (V$_{SUPPLY1}$); and enabled level-shifting means (1-4) receiving an input logic signal (V$_{IN}$) that is referenced to the first supply voltage (V$_{SUPPLY1}$) for generating a corresponding level-shifted output logic signal (V$_{OUT}$) that is referenced to the second supply voltage (V$_{SUPPLY2}$) in response to the input logic signal (V$_{IN}$) by operating enable circuitry (P1,P2,N1,N2) in response to the level-shifted output enable signal (PGOOD$_{OUT}$) to enable normal level-shifting operation while the first (V$_{SUPPLY1}$) and second (V$_{SUPPLY2}$) supply voltages are at normal operating levels and to prevent shoot-through currents from occurring in the enabled level-shifting means (1-4) during the ramping of the first supply voltage (V$_{SUPPLY1}$) and forcing the level-shifted output logic signal (V$_{OUT}$) to a predetermined level during the ramping of the first supply voltage (V$_{SUPPLY1}$).

DETAILED DESCRIPTION OF THE PREFERRED EMBODIMENTS

Figure 3:
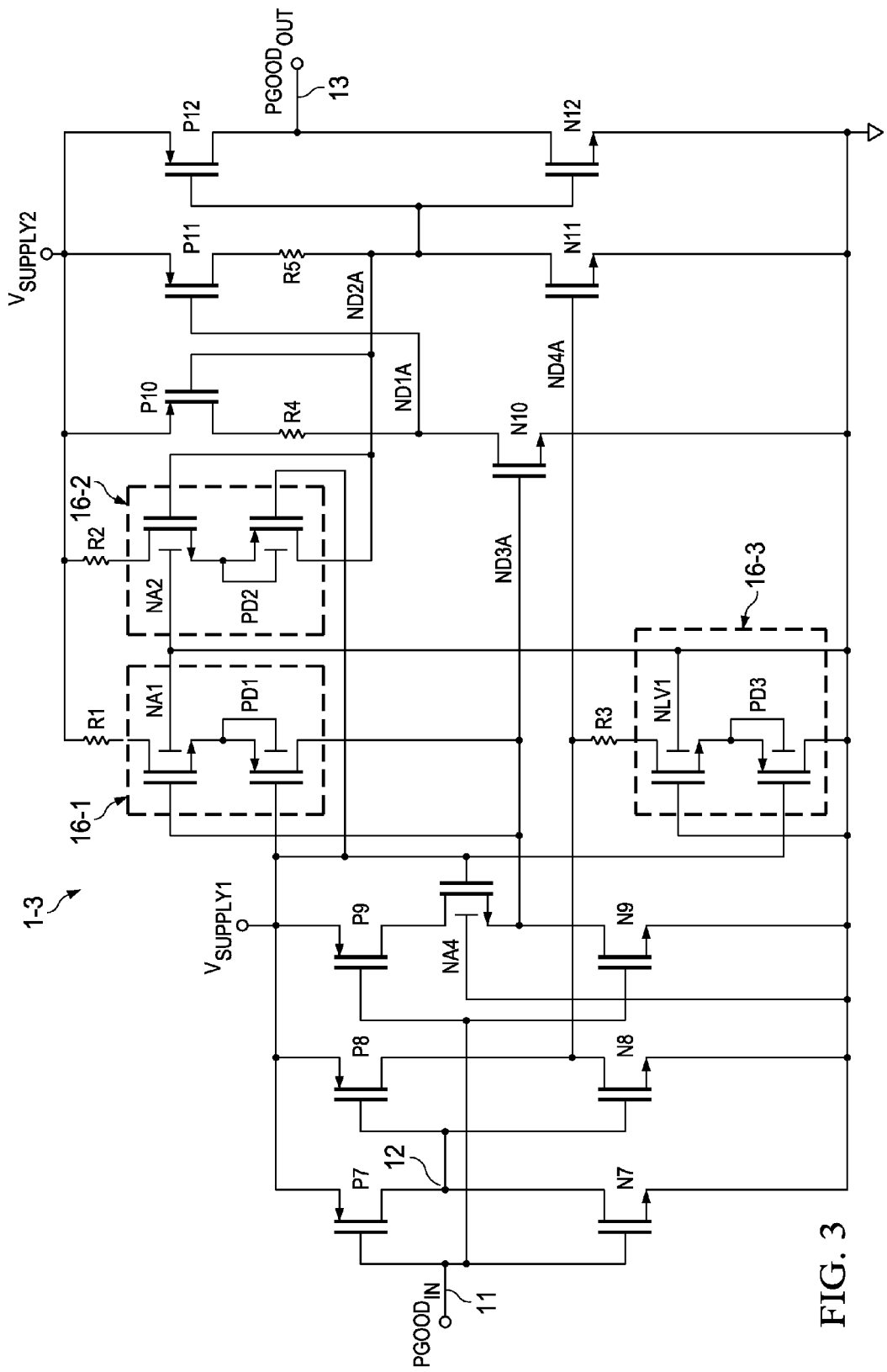
FIG. 3 is a schematic diagram of a circuitry which converts a reliable input enable signal based on a first supply voltage to a reliable output enable signal based on a second supply voltage without producing shoot-through currents and indeterminate logic states.

Referring to FIG. 3, POR (Power On Reset) enable circuit 1-3 receives an input enable signal PGOOD$_{IN}$, which is referenced to a power supply voltage V$_{SUPPLY1}$. PGOOD$_{IN}$ is coupled by conductor 11 to the gate electrodes of a CMOS inverter including a P-channel transistor P7 and a N-channel transistor N7. The source of transistor P7 is connected to V$_{SUPPLY1}$, and its drain is connected by conductor 12 to the drain of transistor N7, the source of which is connected to ground. PGOOD$_{IN}$ also is coupled to the gate electrodes of another CMOS inverter including P-channel transistor P9 and a N-channel transistor N9. The source of transistor P9 is connected to V$_{SUPPLY1}$, and its drain is connected to the drain of a N-channel intrinsic threshold voltage transistor NA4 having its source connected by a node ND3A to the drain of transistor N9, the source of which is connected to ground. Conductor 12 is also connected to the gate electrode of another inverter including a P-channel transistor P8 and a N-channel transistor N8. The source of transistor P8 is connected to V$_{SUPPLY1}$, and its drain is connected by a node ND4A to the drain of transistor N9, the source of which is connected to ground.

Node ND3A is connected to the gate of a N-channel level shifter input transistor N10 having its source connected to ground. Node ND3A also is connected to the gate of a N-channel intrinsic threshold transistor NA1 having its drain coupled by a resistor R1 to a power supply voltage V$_{SUPPLY2}$ and its source connected to the source of a P-channel depletion mode transistor PD1. The gate of transistor PD1 is connected to V$_{SUPPLY1}$ and its drain is connected to node ND3A. N-channel intrinsic threshold transistor NA1 and P-channel depletion mode transistor PD1 together form a "bias transistor pair" 16-1. Node ND4A is connected to the gate of a N-channel level shifter input transistor N11 and also is coupled by a resistor R3 to the drain of a N-channel LVT (low threshold) transistor NLV1 having its gate connected to ground and its source connected to the source of a P-channel depletion mode transistor PD3 having its gate connected to V$_{SUPPLY1}$ and its drain connected to ground. LVT transistor NLV1 and depletion mode transistor and PD3 together form another "bias transistor pair" 16-3.

The drain of level shifter input transistor N10 is connected by node ND1A to one terminal of a resistor R4 and to the gate of a P-channel latching transistor P11 having its source connected to V$_{SUPPLY2}$. The other terminal of resistor R4 is connected to the drain of a P-channel latching transistor P10 having its source connected to V$_{SUPPLY2}$. The drain of latching transistor P11 is connected to one terminal of a resistor R5, the other terminal of which is connected by conductor ND2A to the gate of latching transistor P10, the gate of N-channel intrinsic threshold transistor NA2, and the drain of a P-channel depletion mode transistor PD2. Intrinsic threshold transistor NA2 and depletion mode PD2 together form yet another "bias transistor pair" 16-2.

Node ND2A also is connected to the drain of N-channel level shifter input transistor N11 and the gates of a CMOS output inverter including a P-channel transistor P12 having its source connected to V$_{SUPPLY2}$ and its drain connected by conductor 13 to the drain of a N-channel transistor N12 having its source connected to ground. The drain of intrinsic threshold transistor NA2 is coupled by resistor R2 to V$_{SUPPLY2}$. The gate of depletion mode transistor PD2 is connected to V$_{SUPPLY1}$. A level-shifted output enable signal PGOOD$_{OUT}$ is generated on conductor 13 by enable circuit 1-3. P-channel latching transistors P11 and P11 are considered to be latching components of a "level shifting sub-block" that also includes N-channel transistors N10 and N11 and resistors R4 and R5.

The "bulk" or "body" electrodes of intrinsic threshold transistors NA1, NA2, and NA4 and low threshold transistor NLV1 are connected to ground, and the bulk or body electrodes of depletion mode transistors PD1, PD2, and PD3 are connected to their sources.

In FIG. 3, enable circuit 1-3 uses low threshold (i.e., low V$_T$) field effect transistors, intrinsic field effect transistors, and depletion mode transistors in such a way that when V$_{SUPPLY1}$ is powered down to a low OFF level and V$_{SUPPLY2}$ is powered up to a high ON level the logic states generated on nodes ND1A, ND2A, ND3A, and ND4A are ensured or "guaranteed". Transistors NA1, NA2 and NA4 are "intrinsic threshold" or "intrinsic V$_T$" transistors. (Intrinsic threshold transistors are have a threshold voltage V$_T$ of approximately zero volts for a source to bulk voltage difference of zero volts. Therefore, in this case they are weakly ON when their gate-to-source voltage is zero volts. However, they are turned completely off with a gate-to-source voltage of zero volts if their source-to-bulk voltage is increased to roughly 100 to 200 millivolts. Transistor NLV1 is an LVT (low V$_T$) transistor. LVT transistors are MOS field effect transistors that have a threshold voltage V$_T$ greater than zero volts but less than the threshold voltage of standard MOS field effect transistors. LVT transistors with a gate-to-source voltage of zero may have significant drain-to-source leakage currents. Transistors PD1, PD2, and PD3 are depletion mode transistors. Depletion mode MOS field effect transistors have threshold voltages V$_T$ that are less than zero, and therefore are always in a strongly ON condition if they're gate-to-source voltages are equal to zero, and remain in an ON condition even with applied source-to-bulk voltages of hundreds of millivolts. The output of enable circuit 1-3 is guaranteed to be low if V$_{SUPPLY1}$ is OFF or low and V$_{SUPPLY1}$ is ON or high. Therefore, the elimination of shoot-through current and indeterminate voltage/logic levels in enable circuit 1-3 also is ensured or guaranteed. Potential current leakage paths from V$_{SUPPLY1}$ to V$_{SUPPLY2}$ are blocked by N-type intrinsic threshold transistor NA4. The biasing transistor pairs PD1/NA1, PD2/NA2, and PD3/NLV1 actively drive their respective output nodes when V$_{SUPPLY1}$ is OFF (i.e., is equal to zero volts), but when V$_{SUPPLY1}$ is ON, the sources of depletion mode transistors PD1, PD2, and PD2 rise proportionately with V$_{SUPPLY1}$. This results in a VBS (bulk-to-source voltage) body-effect-induced shift in the threshold voltages V$_T$ of intrinsic transistors NA1 and NA2 and LVT transistor and NLV1. This has the effect of turning those transistors OFF.

The sources of N-channel intrinsic threshold MOS transistors NA1 and NA2 and the source of N-channel low threshold transistor NLV1 are connected to the sources of the corresponding P-channel depletion mode transistors PD1, PD2, and PD3, respectively, such that a rising voltage on the "common source conductor" of each bias transistor pair 16-1, 16-2, and 16-3 creates an induced "body effect" shift in the threshold voltage of the intrinsic mode transistors NA1, NA2, and NA4, and low threshold transistor NLV1. (A relatively low amount of shift also occurs in the threshold voltage V$_T$ of depletion mode transistors PD1, PD2, and PD3 but they nevertheless remain in a conducting condition.) The shift in the threshold voltage turns OFF all of the intrinsic threshold and low threshold transistors OFF into their non-conducting states when V$_{SUPPLY1}$ is OFF as a result of the above mentioned significant positive shifting of V$_T$. In the case where V$_{SUPPLY1}$ is powered up to its ON level and V$_{SUPPLY2}$ is powered down to its OFF level, the body effect-induced V$_T$ shifts of the P-depletion mode and N-channel intrinsic threshold and low threshold transistors in biasing transistor pairs 16-1, 16-2, and 16-3 effectively turns the biasing transistor pairs OFF.

Current limiting resistors R1, R2, and R3 are connected in series with biasing transistor pairs 16-1, 16-2, and 16-3, respectively, so as to minimize shoot-through current during signal transitions in enable circuit 1-3. The P-channel depletion mode transistors in a biasing transistor pair allow instantaneous current conduction between their drains and their sources. As the shared node voltage rises, the body effect on the intrinsic threshold transistors causes them to be non-conducting from their sources to their drains, which are connected to current limiting resistors R1 and R2, respectively. LVT transistor NLV1 combined with intrinsic threshold transistor PD3 acts in a different mode such that when $V_{SUPPLY1}$ is OFF it clamps node ND4A very close to ground so the drain voltage of transistor N11 will not "float up" and allow shoot-through current to flow through transistor N11. This clamping action of transistors NLV1 and PD3 is halted when $V_{SUPPLY1}$ goes to a high level. Finally, transistor NA4 acts to block current leakage via conductor ND3A to $V_{SUPPLY1}$ (through P-channel transistor P9) when $V_{SUPPLY1}$ is equal to zero. As the voltage of node ND3A incrementally increases above $V_{SUPPLY1}$ when its voltage level is close to ground voltage, the body effect of transistor NA4 causes it to turn itself OFF.

Figure 4:
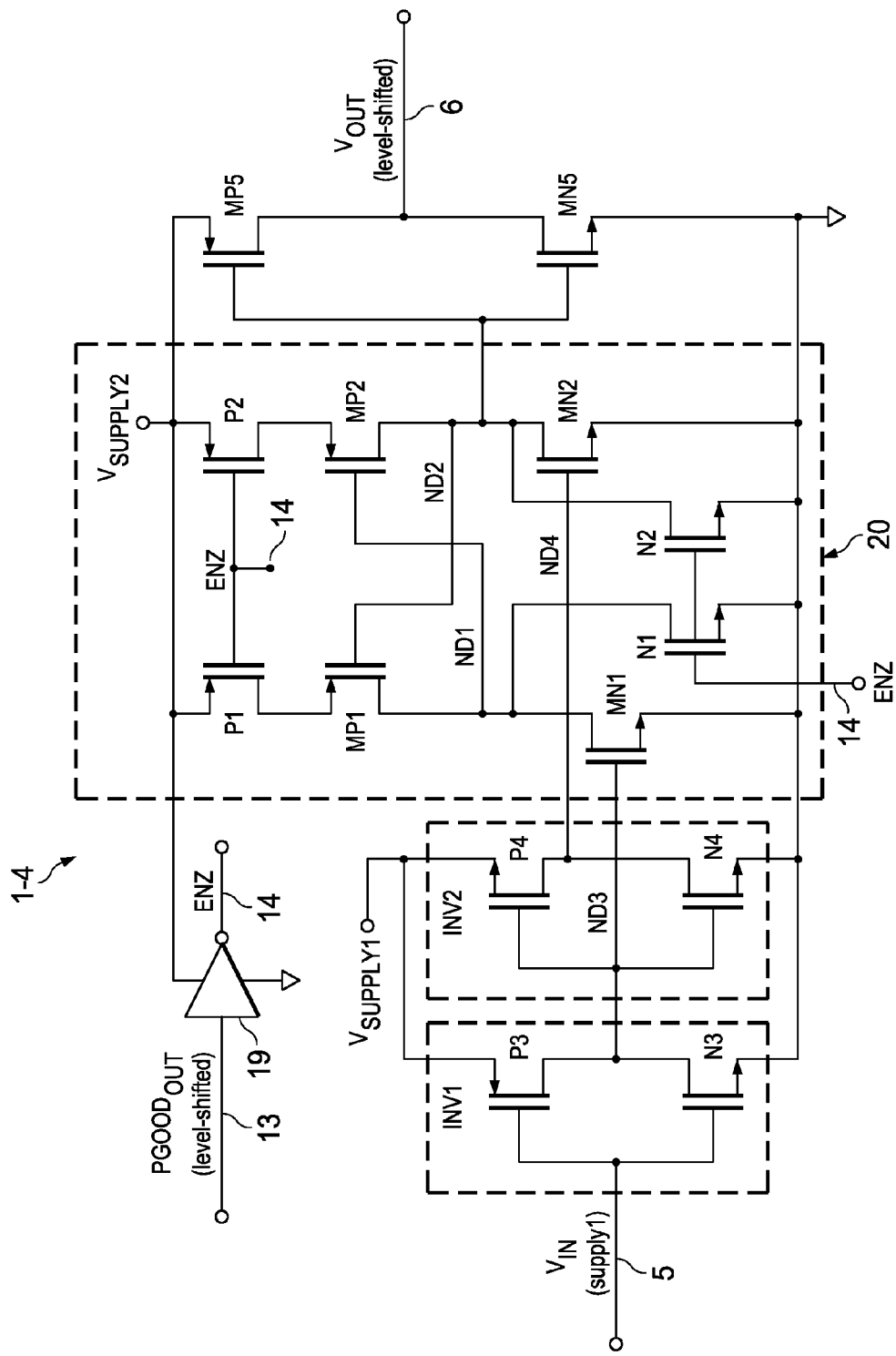
FIG. 4 is a schematic diagram which converts an input logic signal based on a first supply voltage to a corresponding output logic signal based on a second supply voltage when enabled by the output enable signal generated by the circuit of FIG. 3.

Enable circuit 1-3 in FIG. 3 is operated to generate a "master" POR (power on reset) output signal $PGOOD_{OUT}$ that is used as an enable signal for multiple level-shifter circuits, such as the enabled level-shifting circuit 1-4 in FIG. 4, in a system that can be logically disabled so as to prevent shoot-through currents when $V_{SUPPLY1}$ is low and $V_{SUPPLY2}$ is high and thereby avoid indeterminate voltage and logic levels in enable circuit 1-3.

Referring now to FIG. 4, enabled level-shifting circuit 1-4 includes a CMOS inverter INV1 having its input coupled to receive an input signal $V_{IN}$ and its output connected by a conductor or node ND3 to the input of another CMOS inverter INV2 and also to the gate of a N-channel level shifter transistor MN1 having its source connected to ground. Inverter INV1 includes a P-channel transistor P3 having its source connected to $V_{SUPPLY1}$ and its gate connected to $V_{IN}$ on conductor 5 (as in Prior Art FIG. 1). The drain of transistor P3 is connected to the drain of a N-channel transistor N3 having its gate connected to $V_{IN}$ and its source connected to ground. The output inverter of INV1 is connected to the input of CMOS inverter INV2, which includes P-channel transistor P4 and N-channel transistor N4. The output of inverter INV1 also is connected by conductor ND3 to the gate of N-channel transistor MN1 which has its source connected to ground. The output of inverter INV2 is connected by conductor ND4 to the gate of a N-channel level shifter transistor MN2 having its source connected to ground.

The drain of level shifter transistor MN1 is connected by node ND1 to the drain of a P-channel level shifter transistor MP1 which is cross-coupled to the gate of another P-channel level shifter transistor MP2. The source of level shifter transistor MP1 is connected to the drain of a P-channel enable transistor P1 having its gate connected to receive an enable signal ENZ on conductor 14 and its source connected to a second supply voltage $V_{SUPPLY2}$. Similarly, the drain of level shifter transistor MN2 is connected by node ND2 to the drain of P-channel level shifter transistor MP2, which is to the gate of P-channel level shifter transistor MP1. The source of level shifter transistor MP2 is connected to the drain of another P-channel enable transistor P2 having its gate connected to receive enable signal ENZ and also having its source connected to $V_{SUPPLY2}$. The gate of level shifter transistor MP1 is connected by node ND2 to the common drains of level shifter transistors MP2 and MN2 and to the gate electrodes of a CMOS output inverter including P-channel transistor MP5 and a N-channel transistor MN5. The source of transistor MP5 is connected to $V_{SUPPLY2}$ and its drain is connected by $V_{OUT}$ conductor 6 to the drain of transistor MN5, the source of which is connected to ground. During normal operation with ENZ at a low voltage level so that P-channel enable transistors P1 and P2 are turned ON, transistors MP1 and MP2 form a level shifter which generates definite or determinate logic levels on nodes ND1 and ND2. Latching transistors MP1 and MP2 and input transistors MN1 and MN2 form an enabled level shifter circuit 20.

The enable signal ENZ on conductor 14 also is connected to the gates of N-channel enable transistors N1 and N2, which have their sources connected to ground. The drain of enable transistor N1 is connected to node ND1 and the drain of enable transistor N2 is connected to node ND2. ENZ is generated on conductor 14 by means of an inverter 19 in response to the level-shifted enable signal $PGOOD_{OUT}$ generated on conductor 13 by enable circuit 1-3 of FIG. 3.

In FIG. 4, enable transistors P1 and P2 of enabled level-shifting circuit 1-4 conduct when the $V_{SUPPLY2}$-based enable signal $PGOOD_{OUT}$ generated on conductor 13 by enable circuit 1-3 of FIG. 3 is asserted. When $PGOOD_{OUT}$ is "de-asserted", P-channel enable transistors P1 and P2 are turned OFF and N-channel enable transistors N1 and N2 are turned ON and force nodes ND1 and ND2 to a known low ground voltage level or state so the $V_{OUT}$ signal generated by enabled level-shifting circuit 1-4 is forced to a high level. Consequently, there are no paths in enabled level-shifting circuit 1-4 for shoot-through currents.

Figure 1:
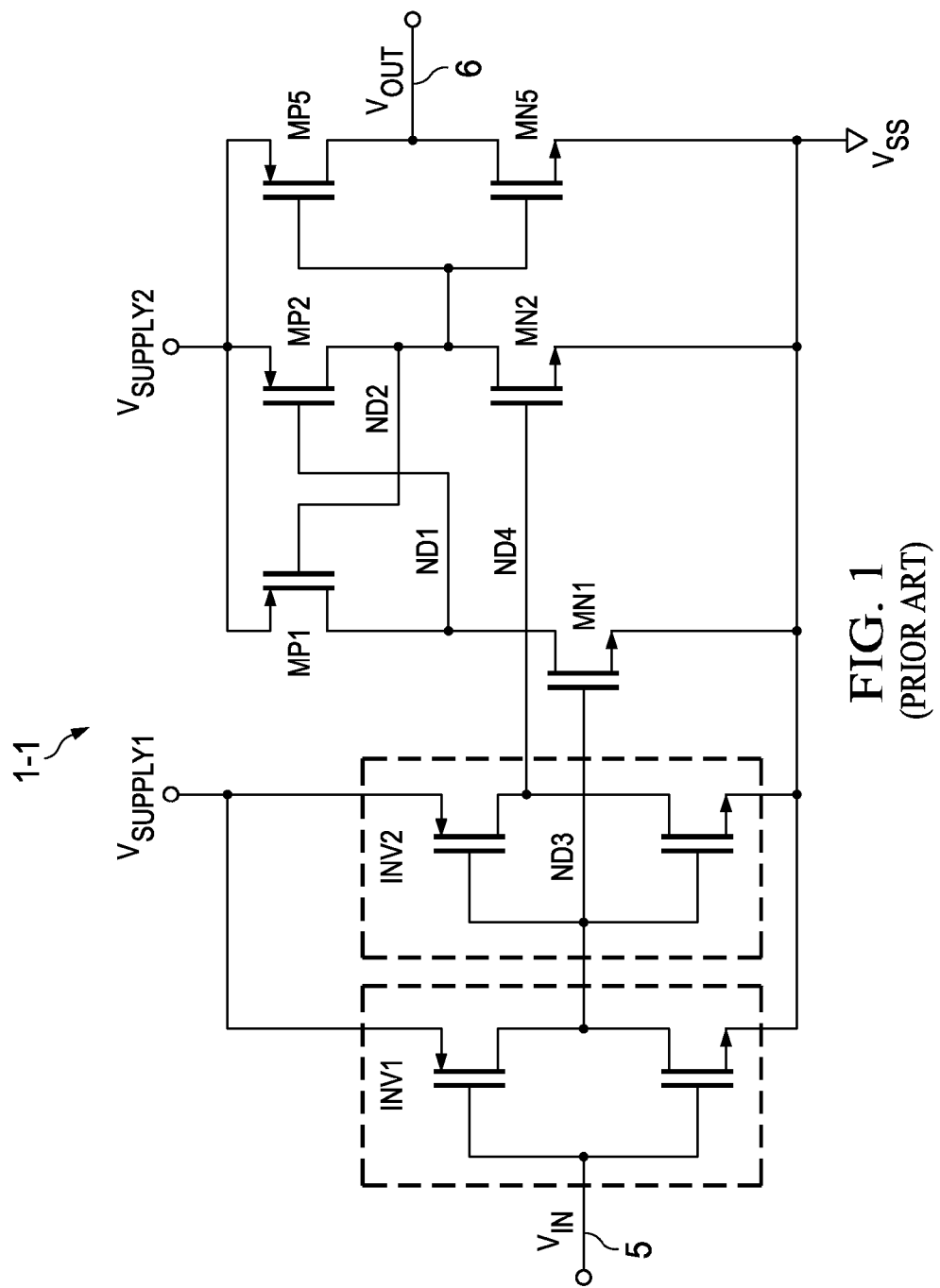
FIG. 1 is a schematic diagram of a conventional general leveling circuit for shifting an output signal from circuitry powered by a first supply voltage to the input of other circuitry powered by a second supply voltage.
Figure 2:
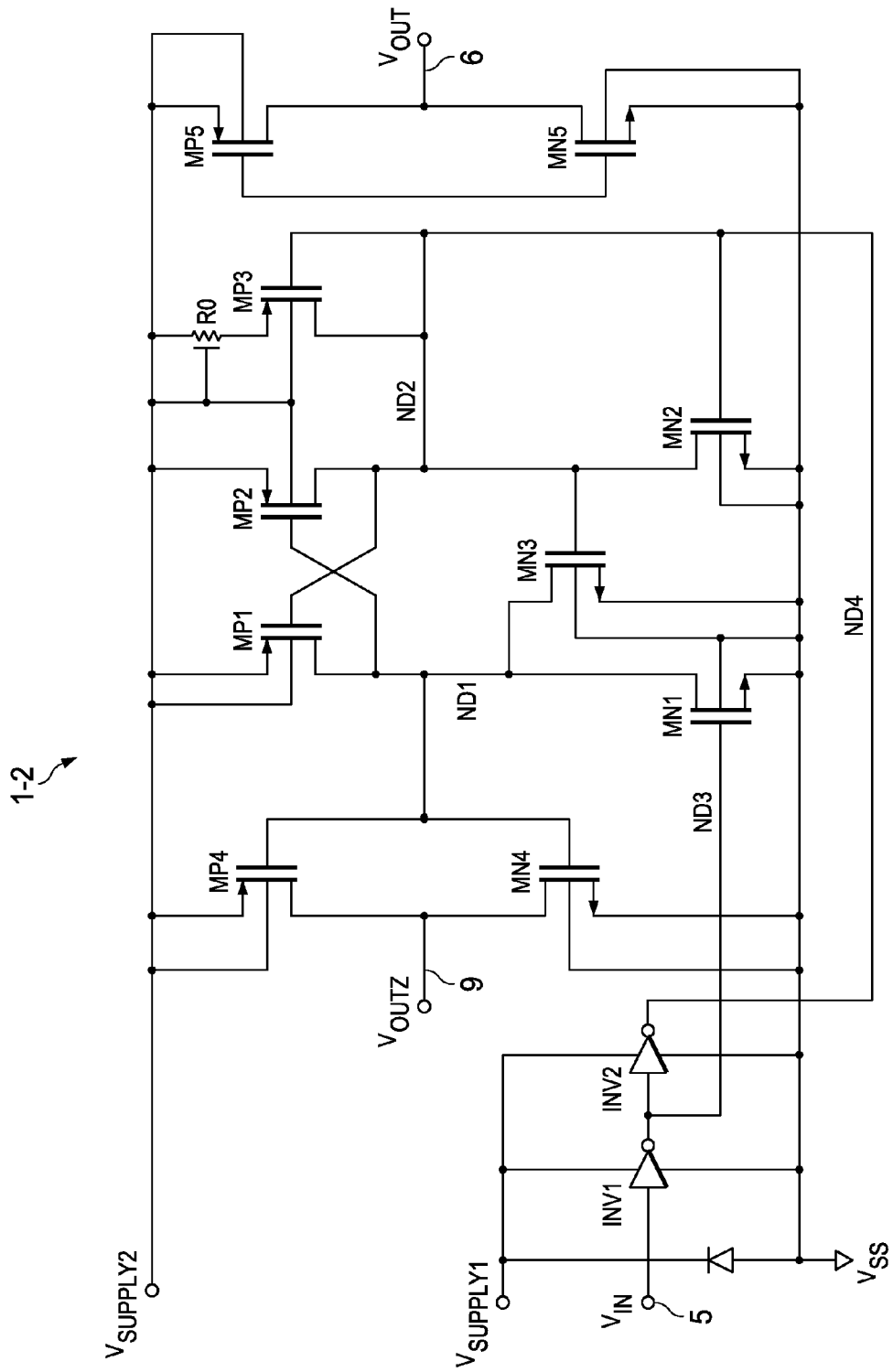
FIG. 2 is a schematic diagram of conventional circuitry which attempts to avoid the shoot-through currents and indeterminate output states of the circuit of FIG. 1.

Both enable circuit 1-3 of FIG. 3 and enabled level-shifting circuit 1-4 of FIG. 4 have switching speeds that are comparable to those of the circuit 1-1 in Prior Art FIG. 1 and the circuit 1-2 in Prior Art FIG. 2. Both of circuits 1-3 in FIGS. 3 and 1-4 in FIG. 4 also prevent the occurrence of shoot-through currents and force definite or "determinate" output logic levels to occur. When disabled, enabled level-shifting circuit 1-4 has no significant current leakage paths therein, and the level-shifted output voltage $V_{OUT}$ on conductor 6 is at a determinate logic level. The combination of enable circuit 1-3 and enabled level-shifting circuit 1-4 provides a complete level-shifting system that is essentially immune to the shoot-through currents and indeterminate logic levels characteristic of the prior art, irrespective of the known output logic levels and independently of whether the power supply voltages $V_{SUPPLY1}$ and $V_{SUPPLY2}$ are ON or OFF.

In contrast to the prior art, the described embodiment of the present invention provides a combination of intrinsic threshold transistors, LVT transistors, and depletion mode transistors which are controlled by the voltage levels of $V_{SUPPLY1}$ and $V_{SUPPLY2}$ so as to avoid the shoot-through currents and indeterminate logic levels that are characteristic of the prior art level shifter circuits. The described biasing transistor pairs are utilized in a master/slave level shifter circuit configuration wherein enable circuit 1-3 of FIG. 3 functions as a master circuit that controls enabled level-shifting circuit 1-4 of FIG. 4, which functions as a slave circuit. The "master" enable circuit 1-3 including the biasing transistor pairs 16-1, 16-2, and 16-3 digitally controls one or more "slave" level shifter circuits such as enabled level-shifting circuit 1-4. When the input enable signal $PGOOD_{IN}$ is de-asserted, the cross-coupled components of the "slave" enabled level-shifters are disabled so as to prevent any static leakage current or shoot-through current from occurring. This causes only known or determinate logic levels of $V_{OUT}$ to be generated. The circuits of FIGS. 3 and 4 ordinarily would be implemented on the same integrated circuit chip, as their master/slave relationship is essential to the beneficial combined operation of enable circuit 1-3 of FIG. 3 and enabled level-shifting circuit 1-4 of FIG. 4. Enable circuit 1-3 can be considered to be a level shifter that uses particular analog circuit techniques to reduce or eliminate shoot-through current leakage independently of the values of $V_{SUPPLY1}$ and $V_{SUPPLY2}$. Enabled level-shifting circuit 1-4 includes considerably simpler digital circuitry wherein its enable input ENZ is controlled enable circuit 1-3 and the resulting configuration essentially eliminates all shoot-through currents and associated indeterminate voltage levels and logic levels.

In one implementation, the operating currents in enable circuit 1-3 and enabled level-shifting circuit 1-4 are very low, in the range from roughly 100 picoamperes to roughly 12 nanoamperes of DC current, yet the circuitry generates only stable, determinate output logic levels irrespective of whether $V_{SUPPLY1}$ and $V_{SUPPLY2}$ are in their ON or OFF conditions. Furthermore, this is accomplished without significant impact on the circuit switching speeds and without causing significant switching transient signals. $V_{SUPPLY1}$ ramps up from a low voltage level in the range of zero volts to a high voltage level in the range of about 1.1 volts to 3.6 volts. The turn-on/turn-off voltage of the N-channel intrinsic threshold transistors NA1, NA2, NLV1, and NA4 is nominally equal to zero volts. The threshold voltage of transistor NLV1 is nominally 200-300 millivolts. If $V_{SUPPLY1}$ is to be ramping up, then $PGOOD_{IN}$ is given a value which causes enabled level-shifting circuit 1-4 of FIG. 4 to be disabled so that there are no transient or static shoot-through currents or indeterminate logic levels are present in it.

As well as being a general interface solution to common serial interface standards such as the SPI (Standard Peripheral Interface), the interface circuit described herein is specifically compatible with the MIPI[RFFE] standard. MIPI[RFFE] is the preferred interface standard for very low power mobile and hand-held RF devices that demand control between two separate power supplies independently of the power supply ON and OFF states.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention.

What is claimed is:

1. Level-shifting circuitry comprising:
   (a) an enable circuit receiving an input enable signal that is referenced to a first supply voltage and also generating a corresponding level-shifted output enable signal that is referenced to a second supply voltage, the enable circuit including bias control circuitry which both prevents shoot-through currents from occurring in the enable circuit during ramping of the first supply voltage and also prevents indeterminate voltage and logic levels of the level-shifted output enable signal during the ramping of the first supply voltage; and
   (b) an enabled level-shifting circuit receiving an input logic signal that is referenced to the first supply voltage and also generating a corresponding level-shifted output logic signal that is referenced to the second supply voltage, the enabled level-shifting circuit including enable circuitry which operates in response to the level-shifted output enable signal to enable normal level-shifting operation while the first and second supply voltages are at normal operating levels and to prevent the shoot-through currents from occurring in the enabled level-shifting circuit during the ramping of the first supply voltage and also to force the level-shifted output logic signal to a predetermined level during the ramping of the first supply voltage.

2. The level-shifting circuitry of claim 1 wherein the enable circuit includes a first CMOS inverter, a second CMOS inverter, and a third CMOS inverter all coupled between the first supply voltage and a reference voltage, an input of the first CMOS inverter and an input of the third CMOS inverter each receiving the input enable signal, an input of the second CMOS inverter being coupled to an output of the first CMOS inverter, an output of the third CMOS inverter being coupled to a first input of a level shifter circuit that is coupled between the first supply voltage and the reference voltage, an output of the second CMOS inverter being coupled to a second input of the level shifter circuit.

3. The level-shifting circuitry of claim 2 wherein the bias control circuitry includes first, second and third transistor pairs, a first output of the level shifter circuit being cross-coupled to a gate of a first latching transistor of the level shifter circuit, a second output of the level shifter circuit being cross-coupled to a gate of a second latching transistor of the level shifter circuit.

4. The level-shifting circuitry of claim 3 wherein the first transistor pair includes a first transistor having a drain coupled to the second supply voltage and a gate coupled to the first input of the level shifter circuit, and wherein the first transistor pair also includes a second transistor having a source coupled to a source of the first transistor, a gate coupled to the first supply voltage, and a drain coupled to the first input of the level shifter circuit;
   wherein the second transistor pair includes a third transistor having a drain coupled to the second supply voltage and a gate coupled to the second output of the level shifter circuit, and wherein the second transistor pair also includes a fourth transistor having a source coupled to the source of the third transistor, a gate connected to the first supply voltage, and a drain coupled to the second output of the level shifter circuit;
   wherein the third transistor pair includes a fifth transistor having a drain coupled to the second input of the level shifter circuit and a gate coupled to the reference voltage, and wherein the third transistor pair also includes a sixth transistor having a source coupled to a source of the fifth transistor, a gate coupled to the first supply voltage, and a drain coupled to the reference voltage; and
   wherein the enable circuit includes a CMOS output inverter having an input coupled to one of the first and second outputs of the level shifter circuit and an output on which the level-shifted output enable signal is produced.

5. The level-shifting circuitry of claim 4 wherein the first and third transistors are N-channel intrinsic threshold transistors and the fifth transistor is a N-channel LVT (low threshold voltage) transistor.

6. The level-shifting circuitry of claim 5 wherein the second, fourth, and sixth transistors are P-channel depletion mode transistors.

7. The level-shifting circuitry of claim 6 wherein body electrodes of the first, third, and fifth transistors are connected to the reference voltage, and wherein body electrodes of the second, fourth, and sixth transistors are connected to their corresponding sources, respectively.

8. The level-shifting circuitry of claim 7 wherein the transistor pairs each have a corresponding output node and each transistor pair actively drives its output node when the first supply voltage is at a first level and wherein when the first supply voltage is at a second level a source voltage of the depletion mode transistor of that transistor pair increases proportionately with the first supply voltage causing bulk-to-source body-effect-induced shifts in threshold voltages of the first, third, and fifth transistors causing them to be turned OFF.

9. The level-shifting circuitry of claim 4 wherein the drain of the first transistor is coupled to the second supply voltage by means of a first resistor so as to perform the function of reducing transient current spikes, wherein the drain of the third transistor is coupled to the second supply voltage by means of a second resistor so as to perform the function of reducing transient current spikes, and wherein the drain of the fifth transistor is coupled to the second input of the level shifter circuit by means of a third resistor so as to perform the function of reducing transient current spikes, and wherein the third CMOS inverter includes an intrinsic N-channel transistor coupled between the drain of a P-channel transistor of the third CMOS inverter and the first input of the level shifter circuit.

10. The level-shifting circuitry of claim 9 wherein the level shifter circuit includes first and second input transistors each having a source coupled to the reference voltage and first and second cross-coupled latching transistors each having a source coupled to the second supply voltage, the first input transistor having a gate coupled to a first level shifter input and the second input transistor having a gate coupled to a second level shifter input, the first latching transistor having a drain coupled by a fourth resistor and a first level shifter output conductor to a gate of the second latching transistor and the drain of the first input transistor, the second latching transistor having a drain coupled by a fifth resistor and a second level shifter output conductor to a gate of the first latching transistor and a drain of the second input transistor, wherein the fourth resistor performs the function of improving the speed level shifter transition rates and reducing shoot-through currents and the fifth resistor also performs the function of improving the speed level shifter transition rates and reducing shoot-through currents.

11. The level-shifting circuitry of claim 1 wherein the enabled level-shifting circuit includes a first CMOS inverter having an input coupled to receive the input logic signal and an output coupled to an input of a second CMOS inverter and to a first input of an enabled level shifter circuit, an output of the second CMOS inverter being coupled to a second input of the enabled level shifter circuit, the first and second CMOS inverters being powered by the first supply voltage, the enabled level shifter circuit including cross-coupled first and second latching transistors, the first latching transistor having a drain coupled by a first level shifter output conductor to a gate of the second latching transistor and the drain of a first input transistor having its gate coupled to the first input of the enabled level shifter circuit and its source coupled to the reference voltage, the second latching transistor having a drain coupled by a second level shifter output conductor to a gate of the first latching transistor and a drain of a second input transistor having a gate coupled to the second input of the enabled level shifter circuit and a source coupled to the reference voltage, first and second enable transistors each having a source coupled to the second supply voltage and a gate coupled to the level-shifted output enable signal, a drain of the first enable transistor being coupled to a source of the first latching transistor, the drain of the second enable transistor being coupled to the source of the second latching transistor, and one of the first and second outputs of the enabled level shifter circuit being coupled to an input of a CMOS output inverter an output of which produces the level-shifted output logic signal.

12. The level-shifting circuitry of claim 11 wherein the gates of the first and second enable transistors are coupled to the level-shifted output enable signal by means of an inverter.

13. The level-shifting circuitry of claim 12 wherein the enabled level shifter circuit includes third and fourth enable transistors each having a source coupled to the first reference voltage and a gate coupled to the level-shifted output enable signal by means of the inverter, drains of the third and fourth enable transistors being coupled to the first and second outputs, respectively, of the enabled level shifter circuit.

14. The level-shifting circuitry of claim 13 wherein the first and second enable transistors and the first and second latching transistors are P-channel transistors and wherein the third and fourth enable transistors are N-channel transistors.

15. A method for operating level-shifting circuitry powered by first and second supply voltages to avoid shoot-through currents and indeterminate voltage levels and indeterminate logic levels in the level-shifting circuitry during ramping of the first supply voltage, the method comprising:

(a) applying an input enable signal that is referenced to the first supply voltage to an input of an enable circuit;

(b) generating a level-shifted output enable signal that is referenced to the second supply voltage in response to the input enable signal by operating bias control circuitry in the enable circuit so as to prevent shoot-through currents from occurring in the enable circuit during the ramping of the first supply voltage and also to prevent occurrence of the indeterminate voltage levels and indeterminate logic levels of the level-shifted output enable signal during the ramping of the first supply voltage;

(c) applying an input logic signal that is referenced to the first supply voltage to an input of an enabled level-shifting circuit; and (d) generating a level-shifted output logic signal that is referenced to the second supply voltage in response to the input logic signal by operating the enabled level-shifting circuit, operating enable circuitry in response to the level-shifted output enable signal to enable normal level-shifting operation of the enabled level-shifting circuit while the first and second supply voltages are at normal operating levels and to prevent the shoot-through currents from occurring in the enabled level-shifting circuit during the ramping of the first supply voltage and to force the level-shifted output logic signal to a predetermined level during the ramping of the first supply voltage.

16. The method of claim 15 including utilizing transistor pairs in the enable circuit, wherein each transistor pair includes an intrinsic threshold transistor having a drain coupled to the second supply voltage, a gate coupled to an input of a level shifter circuit, and a source coupled to a source of a depletion mode transistor, wherein the transistor pairs each have a corresponding output node and each actively drives its output node when the first supply voltage is at a first level and wherein when the first supply voltage is at a second level a source of the depletion mode transistor rises proportionately with the first supply voltage causing a bulk-tosource body-effect-induced shift in a threshold voltage of the intrinsic transistor turning that intrinsic transistor OFF.

17. The method of claim 15 including preventing the shoot-through currents and the indeterminate logic levels in the enabled level-shifting circuit by providing first and second enable transistors each having a source coupled to respond to the second supply voltage and a gate coupled to respond to the level-shifted output enable signal, a drain of the first enable transistor being coupled to a source of a first cross-coupled latching transistor of an enabled level-shifter in the enabled level-shifting circuit, a drain of the second enable transistor being coupled to the source of a second cross-coupled latching transistor in the enabled level-shifter.

18. The method of claim 17 including providing third and fourth enable transistors in the enabled level-shifting circuit, the third and fourth enable transistors each having a source coupled to the first reference voltage and a gate coupled to respond to the level-shifted output enable signal, drains of the third and fourth enable transistors being coupled to first and second outputs, respectively, of the enabled level shifter circuit.

19. The method of claim 15 wherein the shoot-through current can be either static or transient shoot-through current.

20. Level-shifting circuitry powered by first and second supply voltages to avoid shoot-through currents and indeterminate voltage levels and indeterminate logic levels in the level-shifting circuitry during ramping of the first supply voltage, comprising:

(a) an input coupled to receive an input enable signal that is referenced to a first supply voltage;

(b) enable circuit means for generating a corresponding level-shifted output enable signal that is referenced to a second supply voltage in response to the input enable signal by operating bias control circuitry so as to prevent shoot-through currents from occurring in the enable circuit means during the ramping of the first supply voltage and also to prevent occurrence of indeterminate voltage levels and indeterminate logic levels of the level-shifted output enable signal during the ramping of the first supply voltage; and (c) enabled level-shifting means receiving an input logic signal that is referenced to the first supply voltage for generating a corresponding level-shifted output logic signal that is referenced to the second supply voltage in response to the input logic signal by operating enable circuitry in response to the level-shifted output enable signal to enable normal level-shifting operation while the first and second supply voltages are at normal operating levels and to prevent shoot-through currents from occurring in the enabled level-shifting means during the ramping of the first supply voltage and forcing the level-shifted output logic signal to a predetermined level during the ramping of the first supply voltage.

* * * * *